(12) United States Patent
Mizuno et al.

(10) Patent No.: US 7,952,033 B2
(45) Date of Patent: May 31, 2011

(54) MICROSTRUCTURE AND MICROSTRUCTURE MANUFACTURE METHOD

(75) Inventors: Yoshihiro Mizuno, Kawasaki (JP); Norinao Kouma, Kawasaki (JP); Hisao Okuda, Kawasaki (JP); Hiromitsu Soneda, Kawasaki (JP); Tsuyoshi Matsumoto, Kawasaki (JP); Osamu Tsuboi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 605 days.

(21) Appl. No.: 12/039,186

(22) Filed: Feb. 28, 2008

(65) Prior Publication Data
US 2008/0205021 A1 Aug. 28, 2008

(30) Foreign Application Priority Data
Feb. 28, 2007 (JP) .................. 2007-049067

(51) Int. Cl.
*H05K 1/03* (2006.01)
(52) U.S. Cl. ........ 174/255; 174/253; 174/257; 174/259; 174/261
(58) Field of Classification Search .................. 174/255, 174/253, 250, 256, 257, 259, 261, 73.1, 74 R, 174/75 R
See application file for complete search history.

(56) References Cited

U.S. PATENT DOCUMENTS

| | | | | |
|---|---|---|---|---|
| 5,605,614 | A * | 2/1997 | Bornand | 205/50 |
| 7,052,623 | B1 | 5/2006 | Becker et al. | |
| 7,169,649 | B2 * | 1/2007 | Rosa et al. | 438/118 |
| 2002/0185303 | A1 * | 12/2002 | Takeuchi et al. | 174/256 |
| 2004/0154828 | A1 * | 8/2004 | Moller et al. | 174/256 |
| 2004/0231885 | A1 * | 11/2004 | Borland et al. | 174/260 |
| 2005/0112621 | A1 | 5/2005 | Kim et al. | |
| 2005/0194840 | A1 | 9/2005 | Mori et al. | |
| 2006/0223222 | A1 | 10/2006 | Choi et al. | |
| 2009/0129039 | A1 * | 5/2009 | Kariya et al. | 361/782 |
| 2009/0223705 | A1 * | 9/2009 | Yamashita et al. | 174/260 |
| 2010/0025095 | A1 * | 2/2010 | Guo et al. | 174/260 |
| 2010/0089636 | A1 * | 4/2010 | Ramadas et al. | 174/521 |

FOREIGN PATENT DOCUMENTS

| | | |
|---|---|---|
| JP | 2002-527253 A | 8/2002 |
| JP | 2003-19700 A | 1/2003 |
| JP | 2004-341364 A | 12/2004 |
| JP | 2005-156526 A | 6/2005 |
| JP | 2005-279919 A | 10/2005 |
| JP | 2006-72252 A | 3/2006 |
| JP | 2006-279053 A | 10/2006 |
| JP | 2007-9726 A | 1/2007 |

* cited by examiner

*Primary Examiner* — Dameon E Levi
*Assistant Examiner* — Hoa C Nguyen
(74) *Attorney, Agent, or Firm* — Westerman, Hattori, Daniels & Adrian, LLP

(57) ABSTRACT

A microstructure comprises a laminate structure having a first conductor, a second conductor, and an intervening insulator located between the first and the second conductors. The first conductor includes opposite faces in relation to the second conductor, side faces, and edge parts which form the boundaries of the aforementioned opposite faces and side faces. The second conductor includes an extended face extending beyond the edge parts exceeding the first conductor. The insulation film includes an area covering at least part of an edge part and/or at least part of a side face.

5 Claims, 15 Drawing Sheets

| | INSULATION FILM | FIRING POTENTIAL |
|---|---|---|
| WORKING EXAMPLE 1 | PARYLENE (20 nm) | 320 V  330 V  340 V |
| WORKING EXAMPLE 2 | PARYLENE (80 nm) | 350 V  360 V  370 V |
| COMPARATIVE EXAMPLE | NONE | 210 V  220 V |

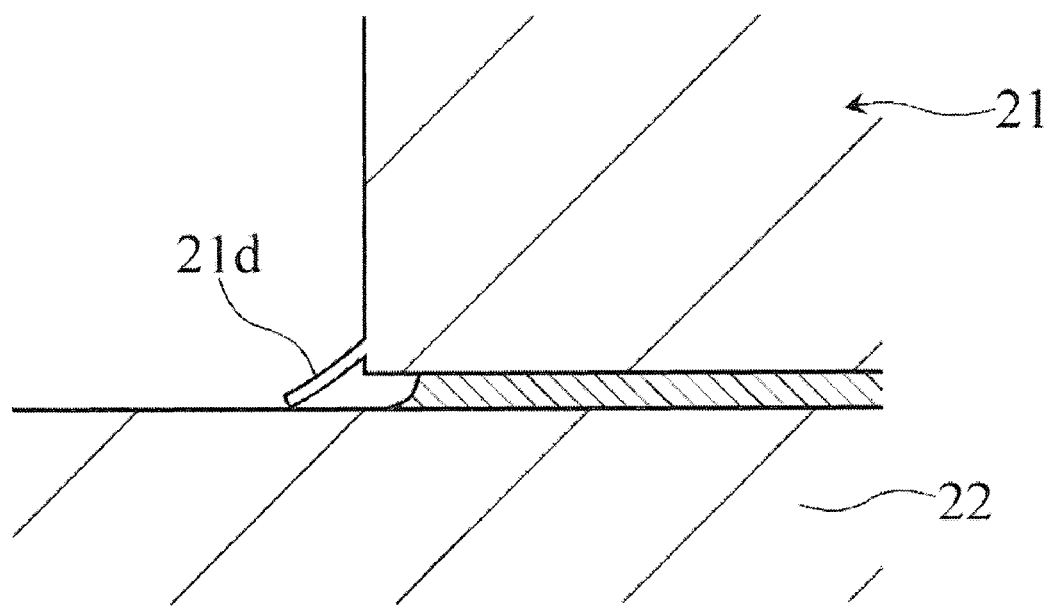

US 7,952,033 B2

MICROSTRUCTURE AND MICROSTRUCTURE MANUFACTURE METHOD

FIELD OF INVENTION

The present invention relates to a microstructure such as a micromirror element, acceleration sensor, angular velocity sensor, and oscillation element which is manufactured through micromachining technology, and the method of manufacturing microstructures.

BACKGROUND OF THE INVENTION

In recent years, microstructures manufactured by using micromachining technology have been gaining attention in various technical fields, and the application of elements having microscopic structures is being promoted. Microscopic movable elements having microscopic moving parts or oscillating parts e.g. micromirror elements, acceleration sensors, or angular velocity sensors are included in the microscopic movable elements herein. Micromirror elements are used in fields such as optical disc technology or optical communications technology to support light reflection functions. Acceleration sensors and angular velocity sensors are used in applications such as robotic attitude control or camera image stabilization. The references listed below provide descriptions of such microstructures:

Japanese Unexamined Patent Application Publication No. 2003-19700;
Japanese Unexamined Patent Application Publication No. 2004-341364; and
Japanese Unexamined Patent Application Publication No. 2006-72252.

SUMMARY OF THE INVENTION

According to one aspect of an embodiment of the present invention, a microstructure comprises a laminate structure having a first conductor, a second conductor, and an intervening insulator located between the aforementioned first and second conductors. The first conductor includes opposite faces and side faces in relation to the second conductor, and edge parts which form the boundaries of the aforementioned opposite faces and side faces. The second conductor includes an extended face extending beyond the edge parts exceeding the first conductor. The insulation film includes an area covering at least part of an edge part and/or at least part of a side face.

BRIEF DESCRIPTION OF THE DRAWINGS

A preferred embodiment of the present invention will be described with reference to the accompanying drawings, wherein:

FIG. 15C is a partial cross-sectional view which explains a comparative example of the microstructure shown in FIG. 8.

DETAILED DESCRIPTION OF THE DRAWINGS

Embodiments of the present invention will now be described with reference to the accompanying drawings.

Figure 1:
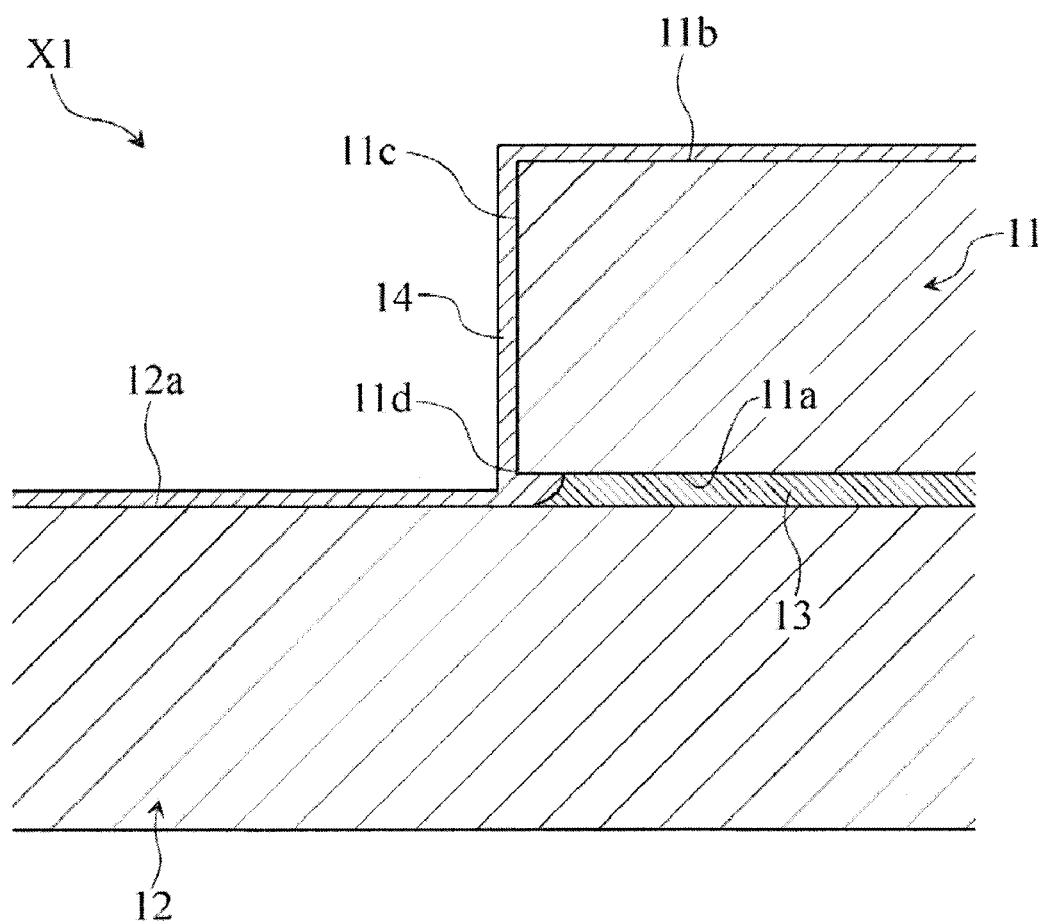
FIG. 1 is a partial cross-sectional view of a microstructure according to the present invention.

FIG. 1 is a partial cross-sectional view of microstructure X1 according to the present embodiment. Microstructure X1, partially comprising a laminate structure having the conductor 11, the conductor 12, and the intervening insulator 13, also comprising the insulation film 14, is a microscopic movable element such as a micromirror element, acceleration sensor, or angular velocity sensor which was fabricated using a micromachining technology such as MEMS (micro-electro-mechanical systems) technology.

The conductor 11 comprising a first face 11a, a second face 11b, and the side face 11c, has an edge part 11d which forms the boundary of the aforementioned first face 11a and side face 11c, and is composed of a material which has conductive properties. The conductor 12, having an extended face 12a which extends beyond the conductor 11, exceeding the edge part 11d, is composed of a material which has conductive properties. These conductors 11 and 12, forming a part of an electrically-conducting path in microstructure X1, elements which support the predetermined functions, are located such that a different electric potential can be provided to each conductor when the elements are being driven. In other words, when the elements are being driven, there are cases where a potential difference occurs between conductors 11 and 12 in microstructure X1.

The intervening insulator 13, which exists between the conductors 11 and 12, is located at a site where it electrically separates the conductors 11 and 12. The thickness of the intervening insulator 13 is e.g. from 0.3 to 7 μm. In FIG. 1 for example, the thickness of the intervening insulator 13 is exaggerated.

Figure 2A:
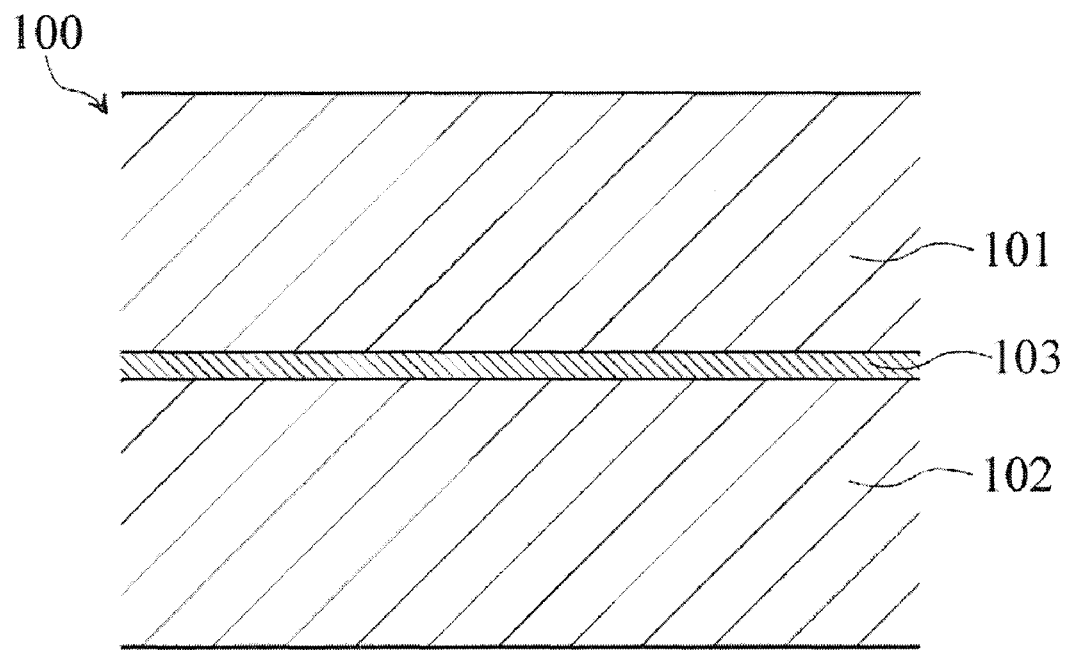
FIG. 2A is a partial cross-sectional view showing part of the process used in the method of manufacturing the microstructure shown in FIG. 1.

The insulation film 14 covers the locations where the first face 11a, the second face 11b, the side face 11c, and the edge part 11d of the conductor 11 do not come into contact with the extended face 12a of the conductor 12 and the conductors 11 and 12 at the intervening insulator 13. According to the present embodiment, the insulation film 14 is composed of e.g. parylene, oxide silicon, or silicon nitride. The thickness of the insulation layer 14 is e.g. from 10 to 500 nm. FIG. 2 shows a part of the process used in the method of manufacturing microstructure X1 as changes in the partial cross-section corresponding to FIG. 1. The method shown in FIG. 1 is one means that can be used to manufacture microstructure X1. When manufacturing microstructure X1, first, a material substrate 100 like that shown in FIG. 2(a) is prepared. The material substrate 100 is an SOI (Silicon on Insulator) wafer comprising a laminate structure having silicon layers 101 and 102, and an intervening insulator layer 103 which is located between silicon layers 101 and 102. Silicon layers 101 and 102 are composed of a silicon material to which conductive properties have been provided by doping the material with impurities. A p-type impurity such as B or an n-type impurity such as P or Sb can be used as the impurity. The intervening insulation layer 103 is composed of e.g. oxide silicon. The thickness of the silicon layer 101 is e.g. from 1 to 100 μm, the thickness of the silicon layer 102 is e.g. from 100 to 600 μm, and the thickness of the intervening insulation layer 103 is e.g. from 0.3 to 7 μm.

Figure 2B:
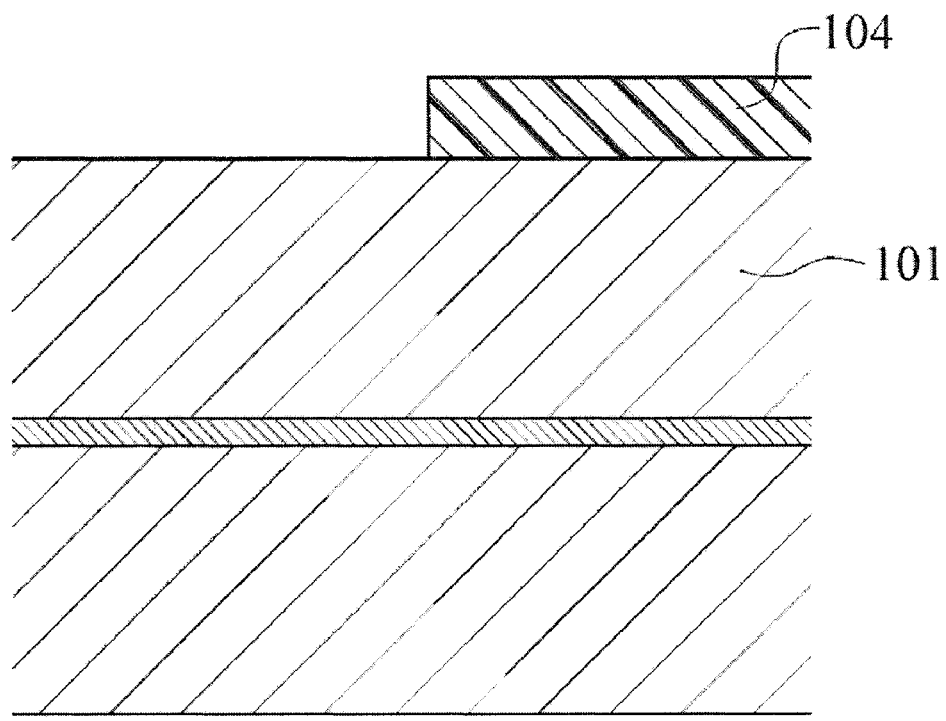
FIG. 2B is a partial cross-sectional view showing part of the process used in the method of manufacturing the microstructure shown in FIG. 1.

Next, as shown in FIG. 2(b), a resist pattern 104 is formed on the silicon layer 101. The resist pattern 104 has a pattern shape corresponding to the conductor 11.

Figure 2C:
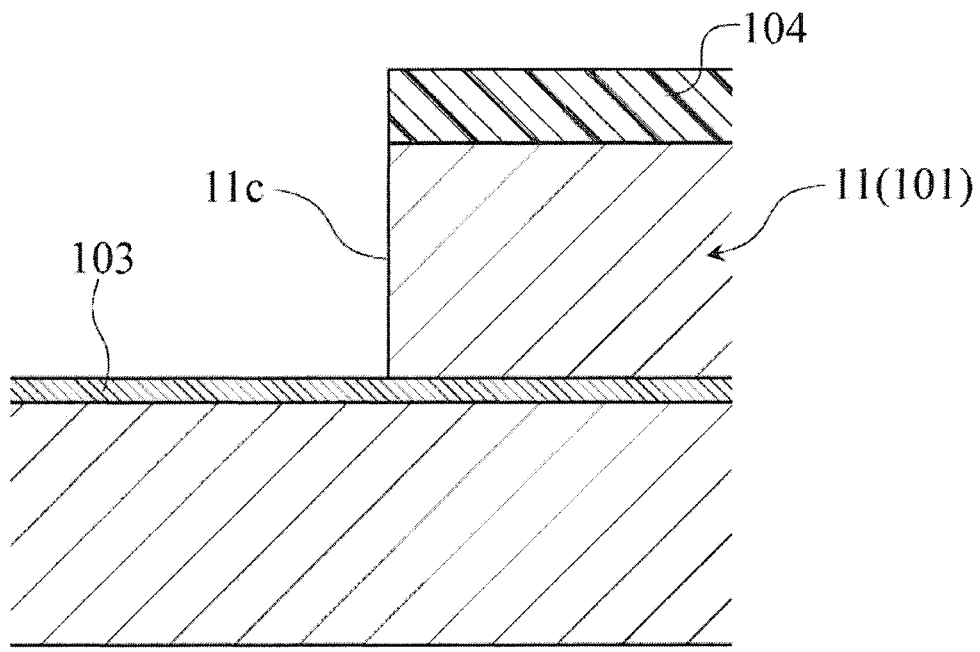
FIG. 2C is a partial cross-sectional view showing part of the process used in the method of manufacturing the microstructure shown in FIG. 1.

Next, as shown in FIG. 2(c), the silicon layer 101 is etched to form the conductor 11. Specifically, the resist pattern 104 is used as a mask, and the silicon layer 101 is anisotropic etched according to the DRIE method. With the DRIE method, it is possible to perform highly anisotropic etching in the Bosch process which alternately comprises etching using SF6 gas and sidewall protection using C4F8 gas. An unintended rough area (not shown here) is formed in the side face 11c of the conductor 11 that was inevitably formed by this process.

Figure 3A:
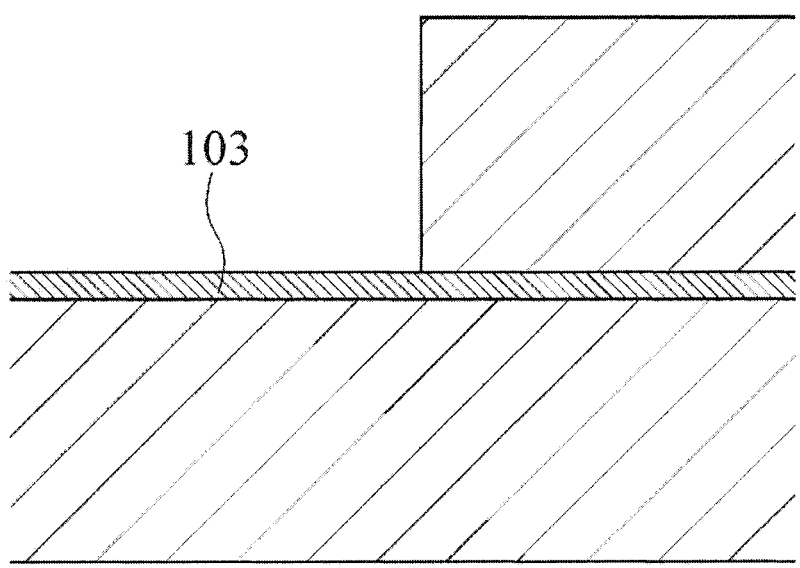
FIG. 3A is a partial cross-sectional view showing a continuation of FIG. 2.
Figure 3B:
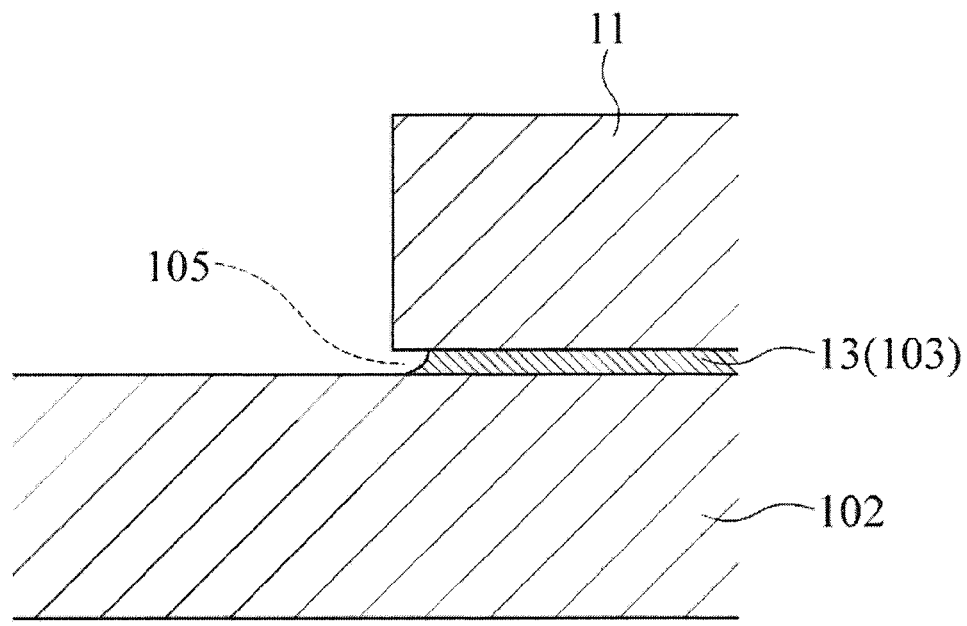
FIG. 3B is a partial cross-sectional view showing a continuation of FIG. 2.

Next, after the resist pattern 104 is eliminated as shown in FIG. 3(a), the intervening insulator 13 is formed by isotropic etching the intervening insulation layer 103 using the wet etching method as shown in FIG. 3(b). Buffered hydrofluoric acid (BHF) composed mostly of hydrofluoric acid and ammonium fluoride for example can be used in the present process as the etching solution. In the present process, etching proceeds from the portion of the intervening insulation layer 103 that was exposed by the process described above (anisotropic etching according to the DRIE method) referring to FIG. 2(c). Then, the intervening insulation layer 103, located between the conductor 11 and the silicon layer 102 was also partially etched and eliminated, forming a so-called undercut 105. The wet etching process described herein must be performed on structures other than the conductor 11 that were formed in the silicon layer 101 to release these structures from the silicon layer 102.

Next, the silicon layer 102 is etched, forming the conductor 12. Specifically, after the predetermined resist pattern (not shown here) is formed on the silicon layer 102, the aforementioned resist pattern is used as a mask, and then the silicon layer 102 is anisotropi etched according to the DRIE method. The conductor 12 which has the predetermined shape can thereby be formed.

Figure 3C:
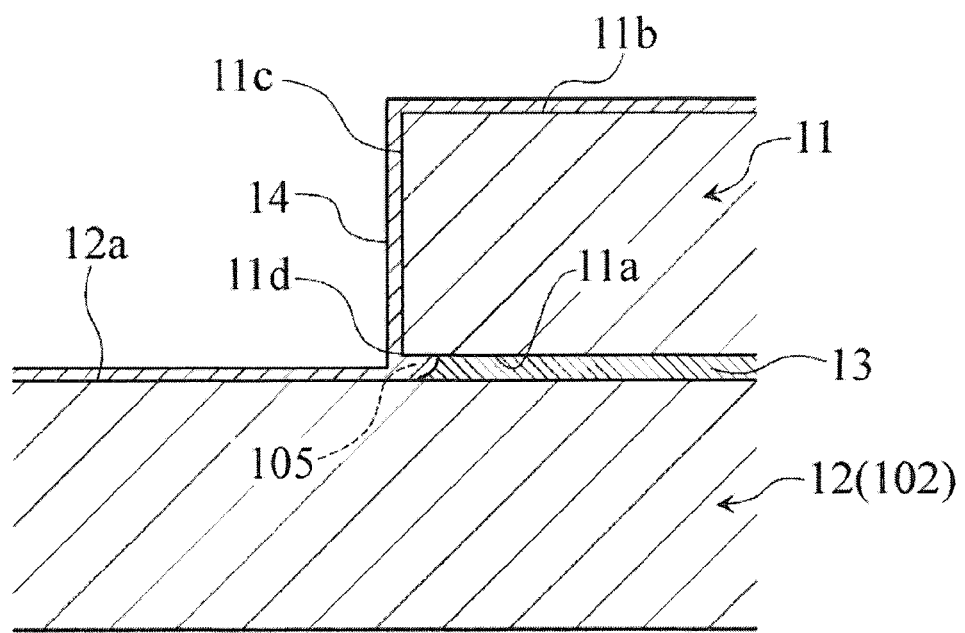
FIG. 3C is a partial cross-sectional view showing a continuation of FIG. 2.

Next, the insulation film 14 is formed as shown in FIG. 3(c). Specifically, the insulation film 14 can be formed by forming film from the predetermined insulating materials according to the predetermined thin film forming technology.

When parylene is used as a constituent material of the insulation film 14, the insulation film 14 can be properly made according to the CVD method. Parylene has outstanding insulation performance and conformality. Parylene, which has outstanding conformality, can also sufficiently penetrate into the undercut 105, which is a microscopic pit. Parylene can properly form a coating in the portions facing the undercut 105 in the edge part 11d of the conductor 11, the portions facing the undercut 105 in the intervening insulator 13, or the portions facing the undercut 105 in the conductor 12.

When oxide silicon is used as a constituent material of the insulation film 14, the insulation film 14 can be properly made by performing the oxygen plasma process. Even if an oxide coating is formed by the oxygen plasma process, the insulation film 14 can be formed to coat the portions facing the undercut 105 in the edge part 11d of the conductor 11, the portions facing the undercut 105 in the intervening insulator 13, or the portions facing the undercut 105 in the conductor 12.

Microstructure X1 having the partial structure shown in FIG. 1 is manufactured according to a method which includes a process like that mentioned herein before.

In the microstructure X1, the insulation film 14, which has an area covering the edge part 11d of the conductor 11, can assist in restraining the occurrence of electric discharges between the edge part 11d of the conductor 11 and the conductor 12 or the extended face 12a thereof when a potential difference occurs between the conductors 11 and 12. An insulation film 14 such as this can restrain the formation of crosslinks between the conductors 11 and 12 when the edge part 11d is liquated out due to heat generated during an electrical discharge. Therefore, the flowing of current along such an electrically-conducting path (current leaks) can be restrained if a potential difference occurs between the conductors 11 and 12 when elements are being driven.

Also, in the microstructure X1, the insulation film 14 which has an area covering the side face 11c of the conductor 11 is helpful in restraining the separation from the side face 11c of the silicon fragment comprising the conductor 11 when a potential difference occurs between the conductors 11 and 12. An insulation film 14 such as this can restrain current leaks between the conductors 11 and 12, wherein the current links are caused by movement of the aforementioned silicon fragment or by the crosslinking of the conductors 11 and 12 by the silicon fragment.

Thus, microstructure X1 is suitable for restraining the occurrence of current leaks between the conductors 11 and 12. The restraining of current leaks is preferred when properly driving microstructure X1, which comprises elements that support predetermined functions.

Figure 4:
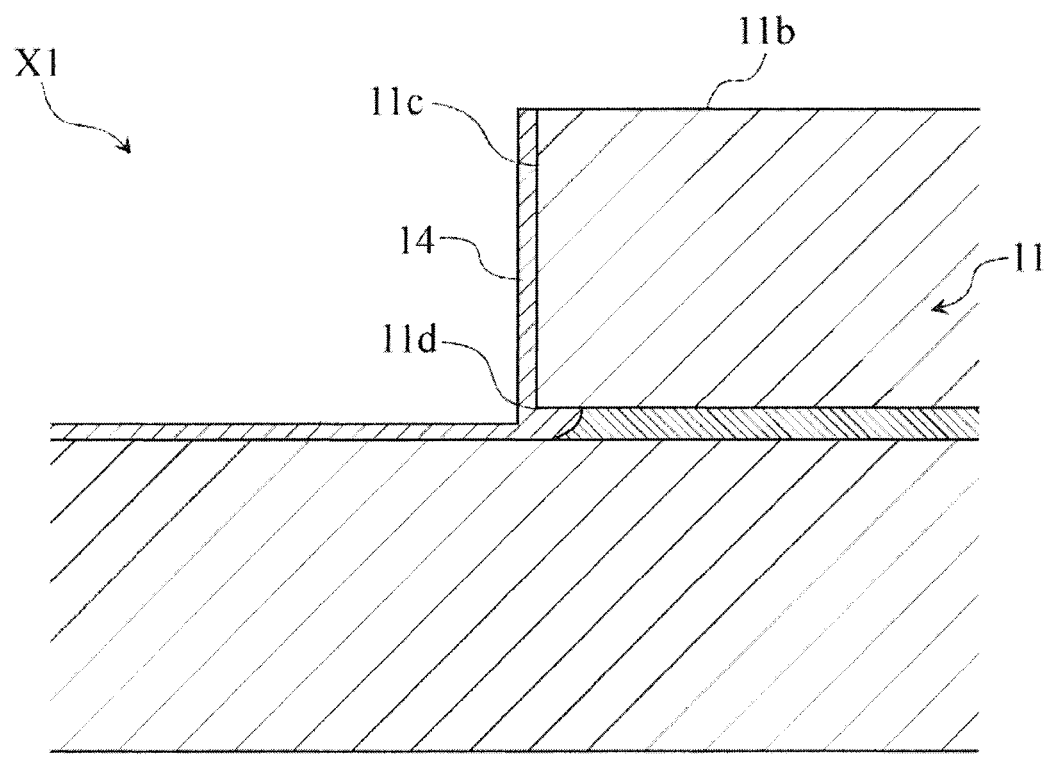
FIG. 4 is a partial cross-sectional view showing the first modification of the microstructure shown in FIG. 1.

FIG. 4 shows the first modification of microstructure X1. Providing the insulation film 14 for microstructure X1 in a way such that, as shown in FIG. 4, the second face 11b of the conductor 11 is not covered is also acceptable. To form an insulation film 14 such as this, after the process described above is performed referring to FIG. 3(c), the aforementioned insulation film 14 is patterned by using the aforementioned mask pattern as a mask and etching the insulation layer 14 to form a predetermined mask pattern on the insulation film 14.

Figure 5:
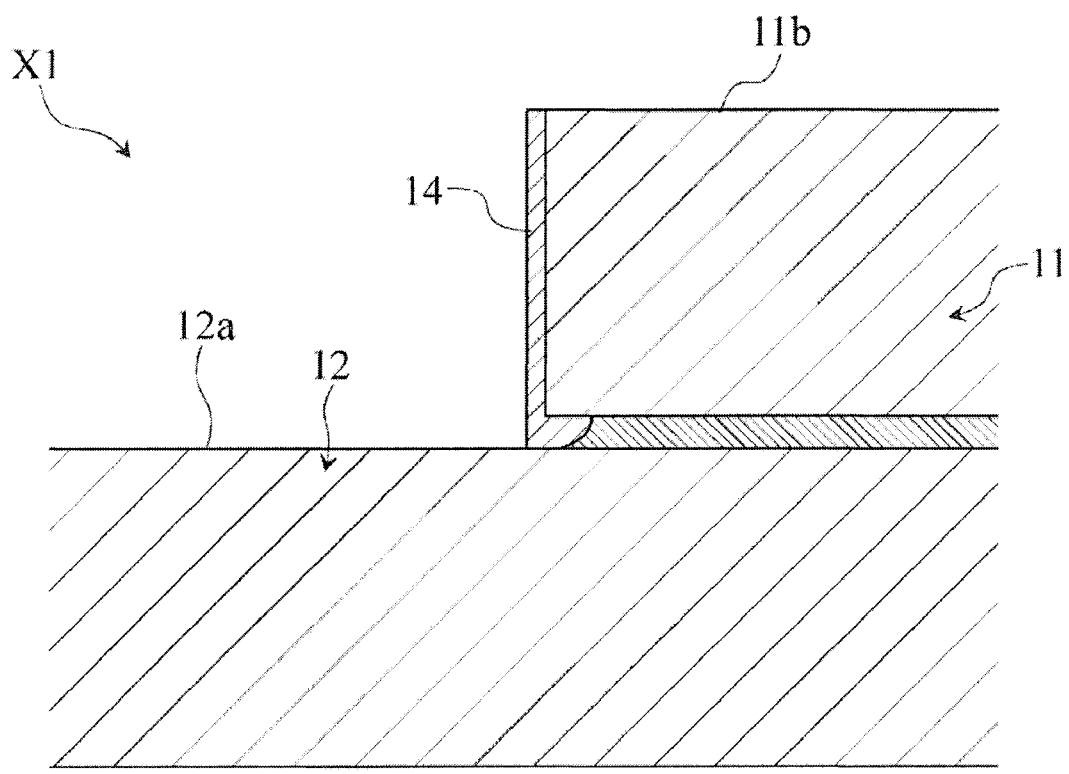
FIG. 5 is a partial cross-sectional view showing the second modification of the microstructure shown in FIG. 1.

FIG. 5 shows the second modification of microstructure X1. Providing the insulation film 14 for microstructure X1 in a way such that, as shown in FIG. 5, the second face 11b of the conductor 11 and the extended face 12a of the conductor 12 is not covered is also acceptable. To form an insulation film 14 such as this, after the process described above is performed referring to FIG. 3(c), the aforementioned insulation film 14 is patterned by using the aforementioned mask pattern as a mask and etching the insulation layer 14 to form a predetermined mask pattern on the insulation film 14.

Figures 6, 7:
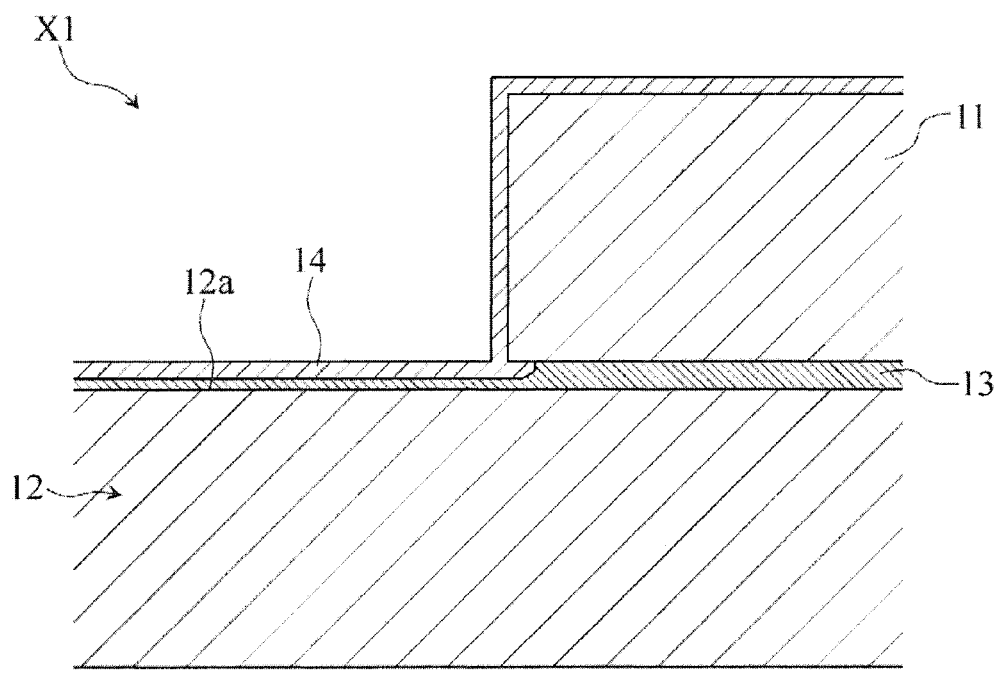
FIG. 6 is a partial cross-sectional view showing the third modification of the microstructure shown in FIG. 1.
FIG. 7 is a table showing the result of a discharge test performed on the microstructures in embodiments 1, 2, and the comparative example.

FIG. 6 shows the third modification of microstructure X1. This modification differs from microstructure X1 shown in FIG. 1 in that the intervening insulator 13 also extends onto the extended face 12a of the conductor 12. To form an intervening insulator 13 such as this, wet etching is stopped at a predetermined time before the extended face 12a of the conductor 12 is exposed during the process described above referring to FIG. 3(b). A structure wherein the extended face 12a is covered by the intervening insulator 13 and the insulation film 14 is preferred when restraining the occurrence of current leaks between the conductors 11 and 12.

Multiple microstructures X1 in working example 1 having the partial structure shown in FIG. 1 were fabricated. In microstructure X1 in working example 1, the conductors 11 and 12 are composed of silicon that was given conductive properties (resistivity of 0.02 ohm centimeters or less) when doped with Sb, such that the thickness of the conductor 11 was 50 μm and the thickness of the conductor 12 was 150 μm. The intervening insulator 13 is composed of oxide silicon wherein the thickness of the intervening insulator 13 is 1 μm. The insulation film 14 is composed of parylene wherein the thickness of the insulation film 14 is 20 nm.

The firing potential of each such microstructure X1 in working example 1 was checked. Specifically, the first step in which a predetermined voltage is applied for 10 seconds between the conductors 11 and 12 in a nitrogen gas atmosphere with a humidity of 5% or less was performed several times with the applied voltage being increased in 10V increments from the first step, when the applied voltage was 10V. The applied voltage for steps in which the discharge phenomenon occurred was identified as the firing potential. The firing potential of each microstructure X1 in working example 1 was 320V, 330V, or 340V.

Multiple microstructures X1 in working example 2 having the partial structure shown in FIG. 1 were fabricated. Microstructure X1 in working example 2 differs from microstructure X1 in working example 1 in that it has an insulating film 14 composed of parylene with a thickness of 80 nm instead of an insulation film 14 composed of parylene with a thickness of 20 nm. When the firing potential of the microstructure X1 in a working example like working example 2 was checked in a similar manner to microstructure X1 in working example 1, the firing potential of each microstructure X1 in working example 2 was 350V, 360V, or 370V.

Figure 8:
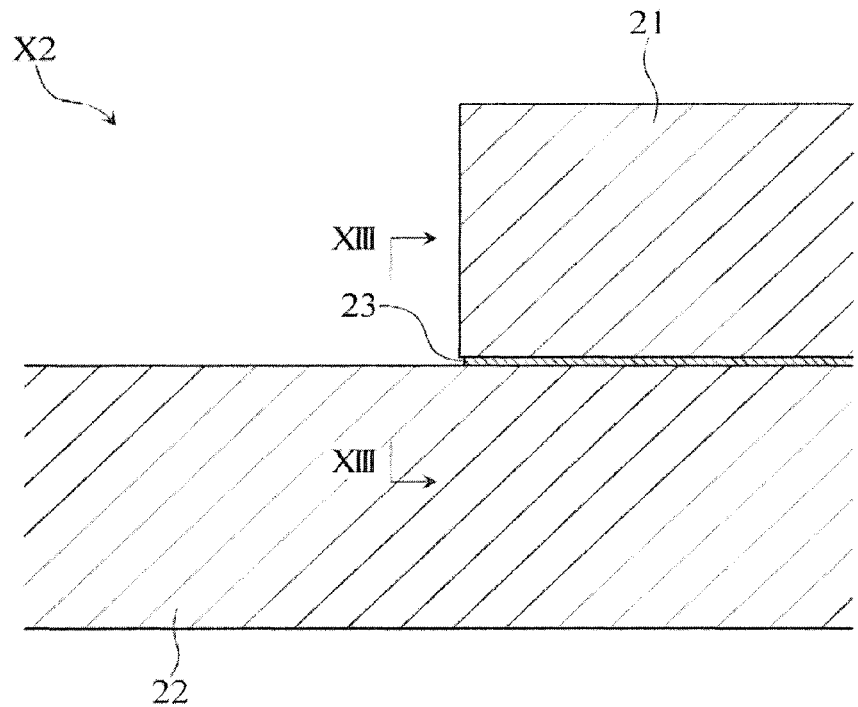
FIG. 8 is a partial cross-sectional view of the microstructure.

FIG. 8 is a partial cross-sectional view of microstructure X2. Microstructure X2 includes a part of a laminate structure having a conductor 21, a conductor 22, and an intervening insulator 23, comprising microscopic movable elements e.g. micromirror elements, acceleration sensors, or angular velocity sensors. The conductors 21 and 22, forming a part of an electrically-conducting path in microstructure X2, elements which support the predetermined functions, are located such that a different electric potential can be provided to each conductor when the elements are being driven. In other words, when the elements are being driven, there are cases where a potential difference occurs between conductors 21 and 22 in microstructure X2.

Figure 9A:
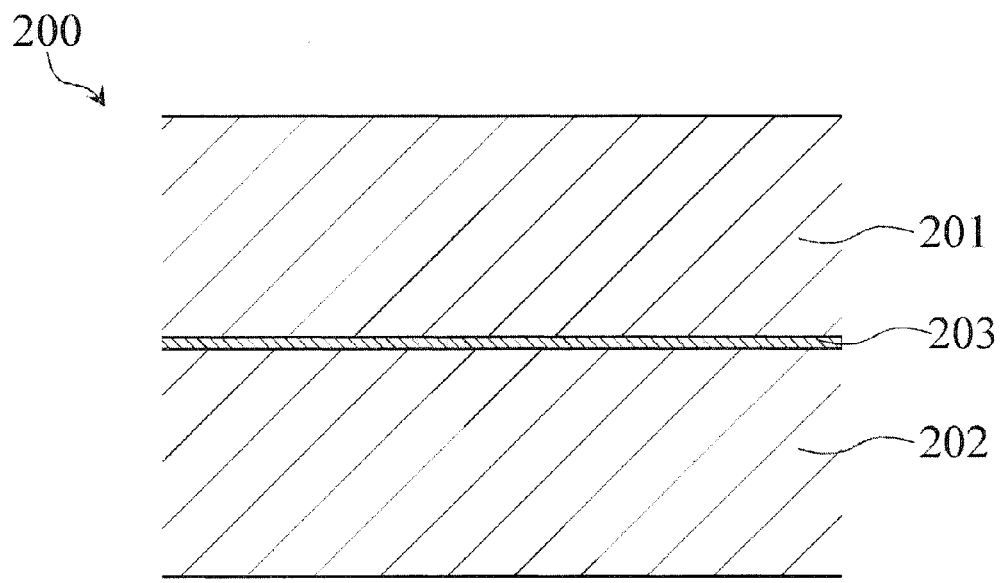
FIG. 9A is a partial cross-sectional view showing a part of the process used in the method of manufacturing the microstructure shown in FIG. 8.

FIG. 9 shows a part of the process used in the method of manufacturing microstructure X2 as changes in the partial cross-section corresponding to FIG. 8. When manufacturing microstructure X2, first, a material substrate 200 like that shown in FIG. 9(a) is prepared. The material substrate 200 is an SOI (Silicon on Insulator) wafer comprising a laminate structure having silicon layers 201 and 202, and an intervening insulator 203 which is located between silicon layers 201 and 202. Silicon layers 201 and 202 are composed of a silicon material to which conductive properties have been provided by doping the material with impurities. The intervening insulation layer 203 is composed of oxide silicon. The thickness of the silicon layer 201 is e.g. from 1 to 100 μm, the thickness of the silicon layer 202 is e.g. from 100 to 600 μm, and the thickness of the intervening insulation layer 203 is e.g. from 0.3 to 7 μm.

Figure 9B:
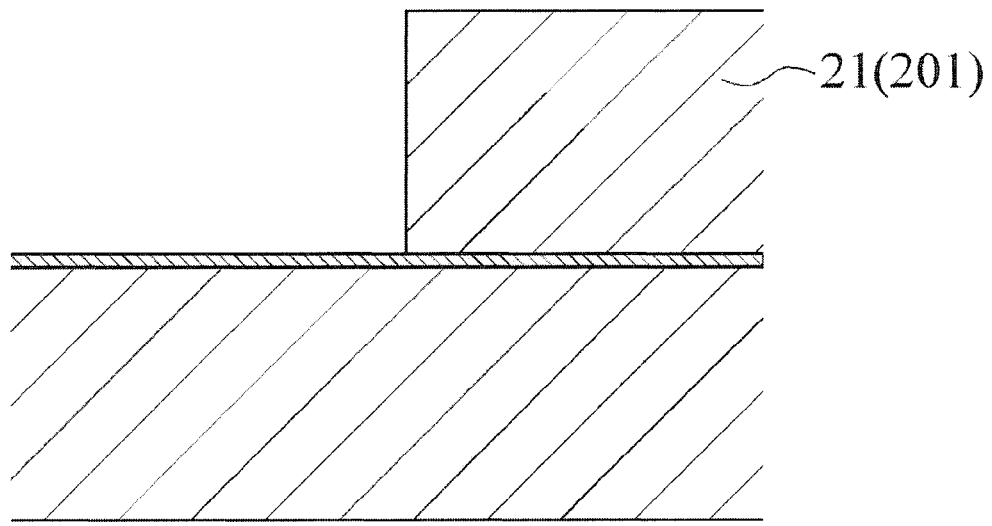
FIG. 9B is a partial cross-sectional view showing a part of the process used in the method of manufacturing the microstructure shown in FIG. 8.

Next, as shown in FIG. 9(b), the silicon layer 201 is etched to form the conductor 21. Specifically, after the predetermined resist pattern (not shown here) is formed on the silicon layer 201, the aforementioned resist pattern is used as a mask, then the silicon layer 201 is anisotropically etched by the DRIE (Deep Reactive Ion Etching) method. With the DRIE method, it is possible to perform highly anisotropic etching in the Bosch process which alternately comprises etching using SF6 gas and sidewall protection using C4F8 gas.

Figure 9C:
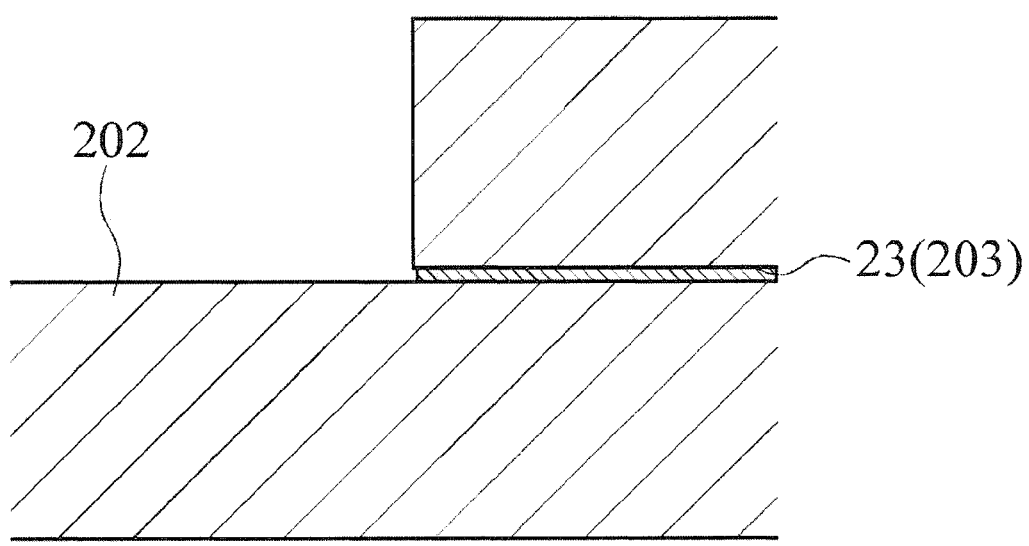
FIG. 9C is a partial cross-sectional view showing a part of the process used in the method of manufacturing the microstructure shown in FIG. 8.

Next, after the resist pattern (not shown here) is eliminated from the silicon layer 201 whenever necessary, as shown in FIG. 9(c), the intervening insulator 23 is formed by isotropic etching the intervening insulation layer 203 using the wet etching method. Buffered hydrofluoric acid (BHF) composed mostly of hydrofluoric acid and ammonium fluoride for example can be used in the present process as the etching solution.

After that, the silicon layer 202 is etched to form the conductor 22. Specifically, after the predetermined resist pattern (not shown here) is formed on the silicon layer 202, the aforementioned resist pattern is used as a mask, and then the silicon layer 202 is anisotropic etched according to the DRIE method. Microstructure X2 having the partial structure shown in FIG. 8 is manufactured according to a method which includes a process like that mentioned herein before.

Figure 10:
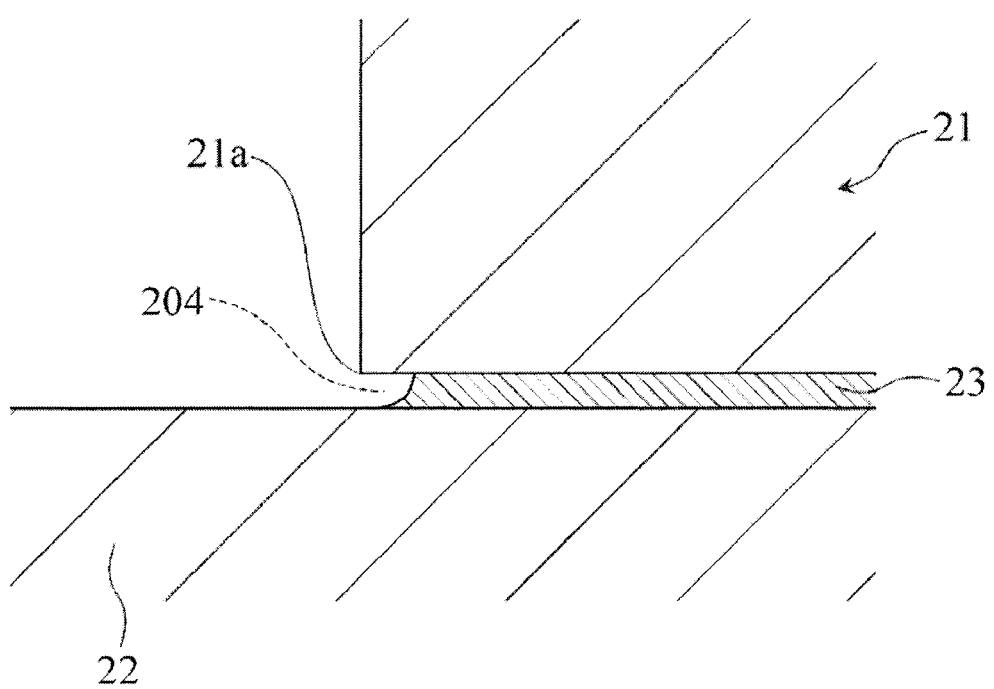
FIG. 10 is a partially enlarged view of FIG. 8.
Figure 11:
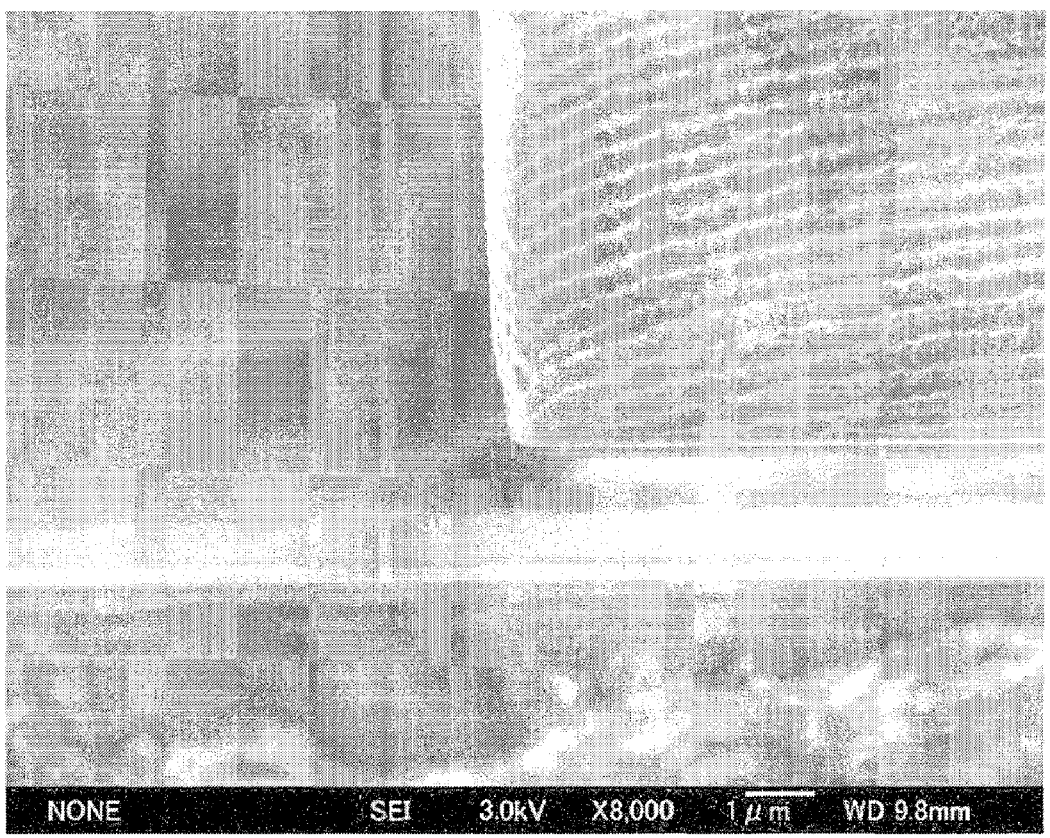
FIG. 11 is a scanning electron micrograph of a part of the microstructure.

FIG. 10 is a partial enlarged view of FIG. 8. FIG. 11, which shows the lateral face shape corresponding to FIG. 8, is a local SEM (scanning electron microscope) photograph of a microstructure manufactured by a method such as that shown in FIG. 9. As shown in FIG. 10, or as shown in FIG. 11 which corresponds to FIG. 10, the conductor 21 has an edge part 21a which is relatively sharply pointed and is exposed. The edge part 21a is exposed because the intervening insulation layer 203, located between the conductor 21 and the silicon layer 202, is also partially etched and eliminated during the wet etching process described above referring to FIG. 9(c) (in other words, this is because a so-called undercut 204 was formed).

Figure 12A:
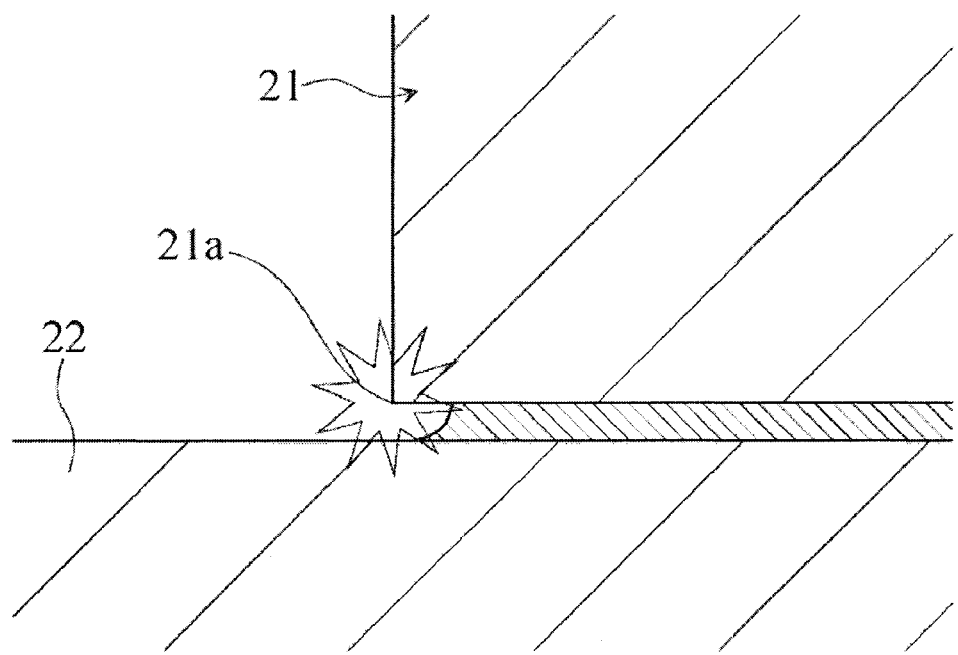
FIG. 12A is a partial cross-sectional view which explains discharges which occur in the microstructure shown in FIG. 8.
Figure 12B:
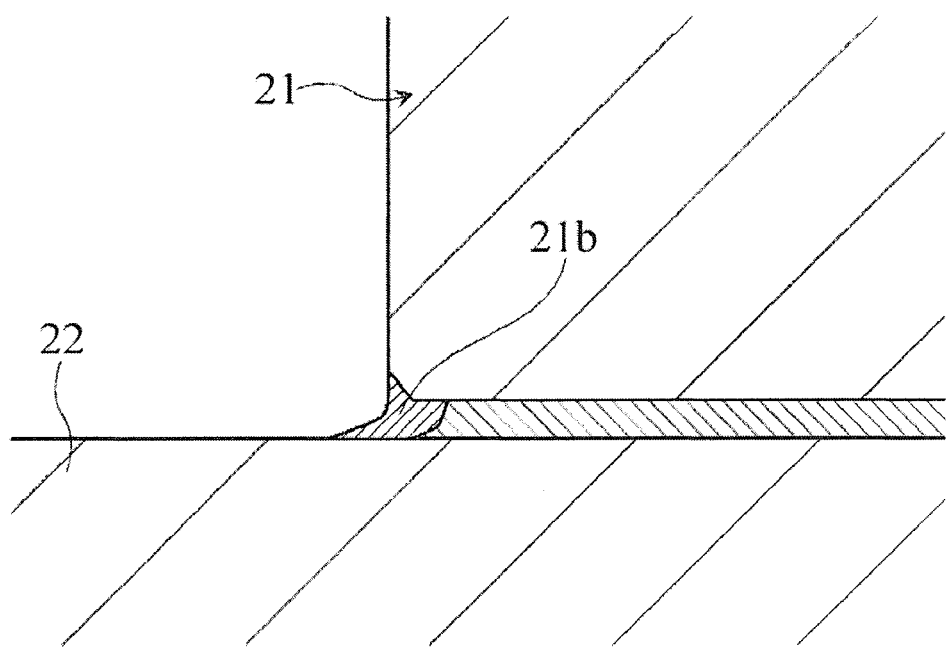
FIG. 12B is a partial cross-sectional view which explains discharges which occur in the microstructure shown in FIG. 8.

As described above, when microstructure X2, comprising elements that support the predetermined function, is driven, there are cases where a potential difference occurs between conductors 21 and 22. When a potential difference occurs between conductors 21 and 22, as shown in FIG. 12(a), there are cases where unintended discharges occur between the conductor 22, which widens and approaches the conductor 21, and the edge part 21a which was exposed at the conductor 21. The sharper of a point that the edge part 21a is, the more likely this discharge is to occur. When a discharge such as this occurs, there are many cases where the edge part 21a is liquated out by heat, which is generated when the discharge occurs, and an electrically conducting path 21b is formed as shown in FIG. 12(b). In the state where an electrically-conducting path 21b is formed, if a potential difference occurs between the conductors 21 and 22 when elements are being driven, a so-called current leak occurs whereby current flows along the electrically-conducting path 21b. Current leaks such as this become obstacles to the proper driving of microstructure X2 which comprises the elements that support the predetermined function.

Figure 13:
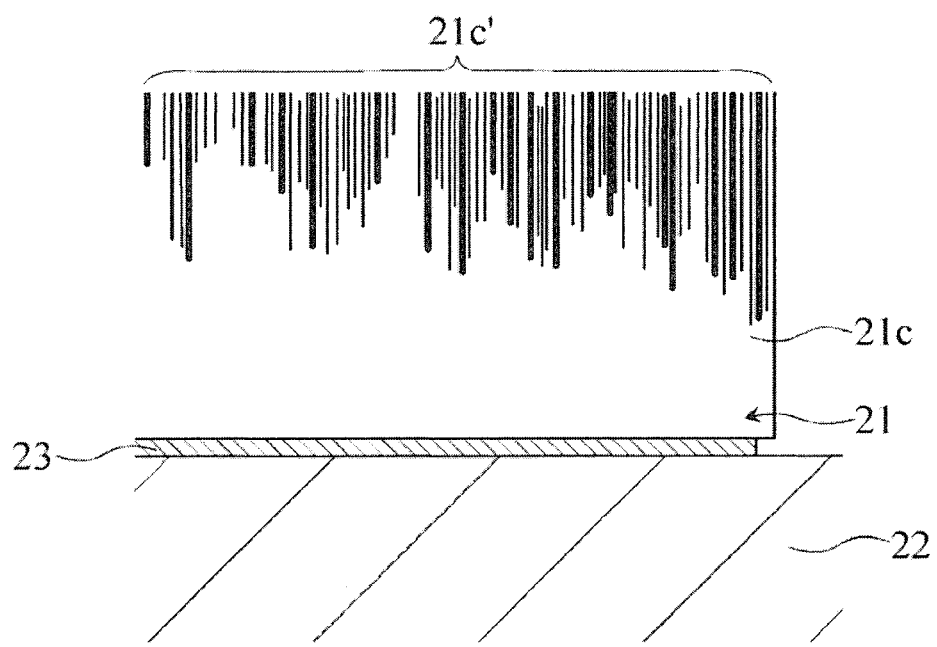
FIG. 13 is a partially enlarged arrow direction view along line XIII-XIII in FIG. 8.
Figure 14:
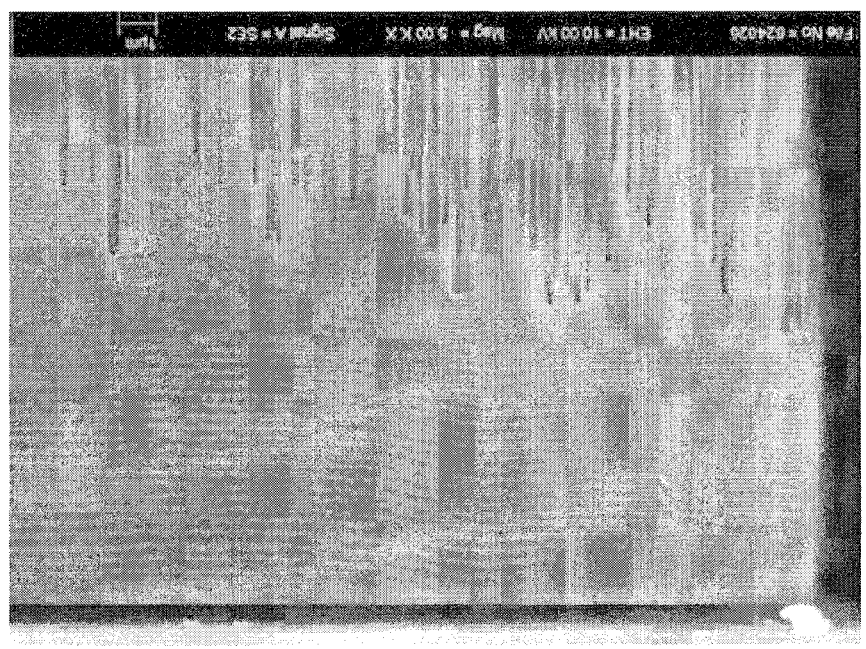
FIG. 14 is a scanning electron micrograph of another part of the microstructure.

FIG. 13 is a partially enlarged cross-sectional view along line XIII-XIII in FIG. 8. FIG. 14, a local SEM photograph of the microstructure fabricated according to a method like that shown in FIG. 9, shows the shape of a side face which corresponds to FIG. 13. As shown in FIG. 13, or as shown in FIG. 14 which corresponds to FIG. 13, a rough area 21c' is formed on the side face 21c of the conductor 21. When a conductor layer 201 is etched according to the DRIE method during the process described above referring to FIG. 9(b), an unintended rough area 21c' is inevitably formed on the side face 21c of the conductor 21 that was formed by etching according to the DRIE method.

The etching process according to the DRIE method is cycle etching comprising a large number of repeated alternations between etching using SF6 gas and sidewall protection using C4F8 gas. Therefore, the degree at which SF6 gas reacts in each cycle of the etching process to proceed with etching and the degree at which C4F8 gas reacts in each cycle of the sidewall protection process to protect the sidewall is not strictly uniform at the conductor layer 201. Also, the contour shape of the resist pattern (not shown here) on the conductor layer 201, which is used as a mask during etching according to the DRIE method, is degraded due to pre-existing microscopic unevenness or roughness, and the aforementioned resist pattern is degraded in the course of being etched. As a result, the roughness of the resist pattern contour shape either varies or is increased. The unintended rough area 21c' is believed to inevitably be formed on the side face 21c of the conductor 21 for the above reasons.

Figure 15A:
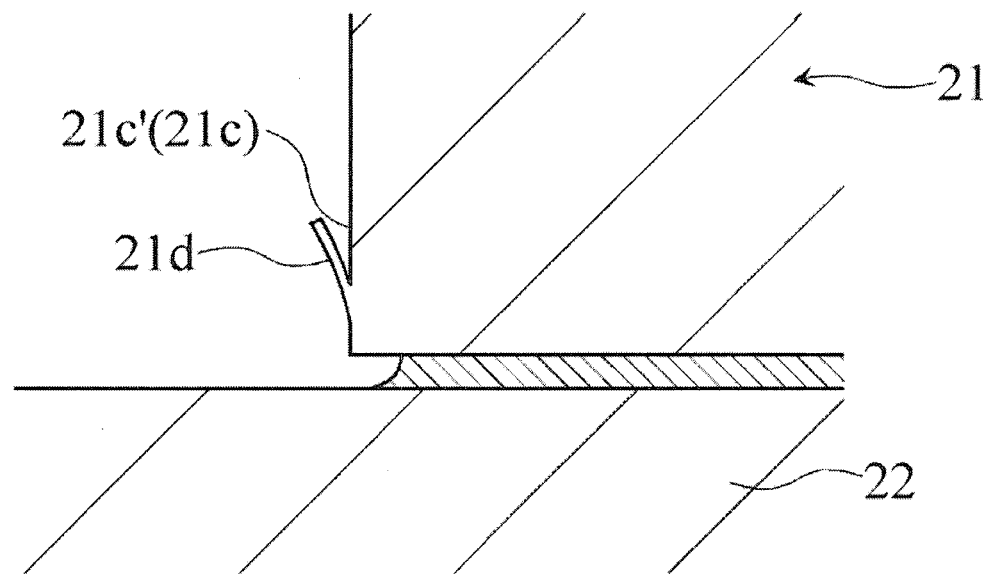
FIG. 15A is a partial cross-sectional view which explains a comparative example of the microstructure shown in FIG. 8.
Figure 15B:
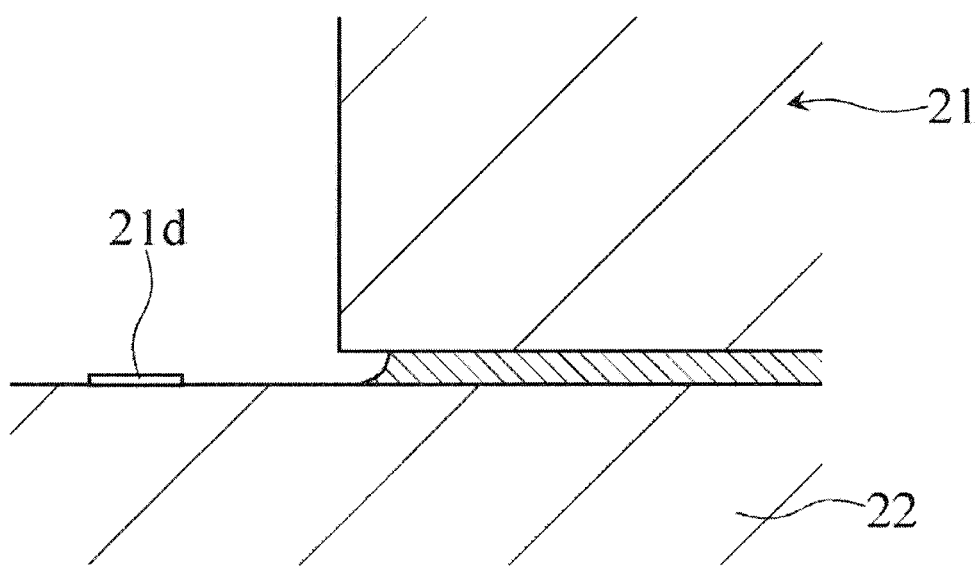
FIG. 15B is a partial cross-sectional view which explains a comparative example of the microstructure shown in FIG. 8.

As shown in FIG. 15(a), there are cases where a microscopic silicon fragment 21d, which easily falls away from the body of the conductor 21, exists on rough area 21c'. If a potential difference occurs between the conductors 21 and 22 when elements are being driven, there are cases where an electrostatic force acts on the silicon fragment 21d and moves the aforementioned silicon fragment 21d as shown in FIG. 15(b). The movement of this silicon fragment causes momentary current leaks to occur between the conductors 21 and 22 when elements are being driven. Also, if a potential difference occurs between the conductors 21 and 22 when elements are being driven, there are cases where an electrostatic force acts on the silicon fragment 21d, causing a displacement of the aforementioned silicon fragment 21d as shown in FIG. 15(c), forming a crosslink between the conductors 21 and 22. If a potential difference occurs between the conductors 21 and 22 due to the silicon fragment 21d in a state where the conductors 21 and 22 were crosslinked, a current link occurs in which current flows through the silicon fragment 21d. Current leaks such as these become obstacles to the proper driving of microstructure X2 which comprises the elements that support the predetermined function.

Multiple microstructures X2 in the comparative example having the partial structure shown in FIG. 8 were fabricated. Microstructure X2 in the comparative example differs from the microstructure X1 in working examples 1 and 2 in that this microstructure does not have the insulation film 14. When the firing potential of microstructure X2 in a comparative example like this was checked in a manner similar to microstructure X1 in working example 1, the firing potential of each microstructure X2 in the comparative example was 210V or 220V.

The table in FIG. 7 summarizes the firing potential of the microstructures X1 and X2 in working examples 1 and 2 and in the comparative example. Microstructure X1 in working examples 1 and 2 showed a higher firing potential than microstructure X2 in the comparative example. This is believed to be caused by the existence of the insulation film 14. Current leaks were more restrained in microstructure X1 in working examples 1 and 2, which showed a high firing potential, than in microstructure X2 in the comparative example. Additionally, microstructure X1 in working example 1 which had a thin insulation film 14 with a thickness of 20 nm also showed a sufficiently high firing potential. A thin insulation film 14 is preferred since it eliminates the effect which microstructure X1, an element that supports predetermined functions, has on operating characteristics.

We claim:

1. A microstructure, comprising:
    a first conductor having a joint face, a side face, and an edge part forming a boundary to the joint face and the side face;
    a second conductor having an extended face extending beyond the joint face of the first conductor exceeding past the edge part;
    an intervening insulator forming a laminate structure located between the joint face of the first conductor and the second conductor opposite the joint face;
    a pit underneath the edge part, the pit being defined by the joint face, the side face of the intervening insulator, and the extended face; and
    an insulation film having an area covering at least part of the edge part and/or at least part of the side face.

2. The microstructure according to claim 1, wherein the insulation film has an area covering at least part of the extended face of the second conductor.

3. The microstructure according to claim 1, wherein the intervening insulator has a site extending onto the extended face of the second conductor.

4. The microstructure according to claim 3, wherein the insulation film has an area covering at least part of the site of the intervening insulator.

5. The microstructure according to claim 1, wherein the insulation film is a parylene film, an oxide silicon film, or a silicon nitride film.

* * * * *